United States Patent
Loubet et al.

(10) Patent No.: US 12,166,042 B2
(45) Date of Patent: Dec. 10, 2024

(54) STACKED NANOSHEET GATE-ALL-AROUND DEVICE STRUCTURES

(71) Applicant: International Business Machines Corporation, Armonk, NY (US)

(72) Inventors: Nicolas Loubet, Guilderland, NY (US); Huiming Bu, Glenmont, NY (US); Balasubramanian Pranatharthiharan, Santa Clara, CA (US)

(73) Assignee: International Business Machines Corporation, Armonk, NY (US)

(*) Notice: Subject to any disclaimer, the term of this patent is extended or adjusted under 35 U.S.C. 154(b) by 523 days.

(21) Appl. No.: 17/502,374

(22) Filed: Oct. 15, 2021

(65) Prior Publication Data
US 2023/0121650 A1 Apr. 20, 2023

(51) Int. Cl.
| H01L 27/12 | (2006.01) |
| H01L 21/02 | (2006.01) |
| H01L 21/3115 | (2006.01) |
| H01L 21/84 | (2006.01) |
| H01L 29/06 | (2006.01) |

(Continued)

(52) U.S. Cl.
CPC .... *H01L 27/1203* (2013.01); *H01L 21/02532* (2013.01); *H01L 21/0259* (2013.01); *H01L 21/3115* (2013.01); *H01L 21/84* (2013.01); *H01L 29/0665* (2013.01); *H01L 29/42392* (2013.01); *H01L 29/66553* (2013.01); *H01L 29/66742* (2013.01); *H01L 29/78618* (2013.01); *H01L 29/78696* (2013.01)

(58) Field of Classification Search
CPC ............ H01L 21/0259; H01L 29/0665; H01L 29/42392; H01L 29/66553; H01L 27/1203; H01L 21/02532; H01L 21/84
See application file for complete search history.

(56) References Cited

U.S. PATENT DOCUMENTS 9,660,028 B1 5/2017 Cheng
9,947,804 B1* 4/2018 Frougier ............... H01L 29/165
(Continued)

FOREIGN PATENT DOCUMENTS

DE 102022100084 A1 * 11/2022 ....... H01L 21/02565

OTHER PUBLICATIONS

Nicolas Loubet et al., "Stacked nanosheet gate-all-around transistor to enable scaling beyond FinFET," Symposium on VLSI Technology, Aug. 2017, pp. 1-3.

*Primary Examiner* — Mamadou L Diallo
(74) *Attorney, Agent, or Firm* — L. Jeffrey Kelly; Otterstedt & Kammer PLLC (57) ABSTRACT

A semiconductor device including a substrate; a continuous buried oxide layer (BOX) formed on the substrate; and a plurality of nanosheet gate-all-round (GAA) device structures on the BOX, wherein a first plurality of stacked gates of the nanosheet GAA device structures are disposed in a logic portion of the substrate and have a first nanosheet width, wherein a second plurality of stacked gates of the nanosheet GAA device structures are disposed in a high density region of the substrate and have a second nanosheet width less than the first nanosheet width, wherein the nanosheet GAA device structures are disposed directly on the continuous buried oxide layer, and wherein a bottom layer of the nanosheet GAA device structures is a bottom gate formed directly on the BOX.

20 Claims, 7 Drawing Sheets

(51) Int. Cl.
*H01L 29/423* (2006.01)
*H01L 29/66* (2006.01)
*H01L 29/786* (2006.01)

(56) References Cited

U.S. PATENT DOCUMENTS

| | | | |
|---|---|---|---|
| 10,002,939 B1 | 6/2018 | Cheng | |
| 10,069,015 B2 | 9/2018 | Cheng | |
| 10,177,235 B2* | 1/2019 | Balakrishnan | H01L 21/84 |
| 10,192,867 B1 | 1/2019 | Frougier | |
| 10,276,442 B1* | 4/2019 | Xie | H01L 21/823807 |
| 10,312,323 B2 | 6/2019 | Cheng | |
| 10,441,185 B2* | 10/2019 | Rogers | A61B 5/4875 |
| 10,490,559 B1* | 11/2019 | Ando | H01L 21/0262 |
| 10,516,064 B1 | 12/2019 | Cheng | |
| 10,892,331 B2 | 1/2021 | Yamashita | |
| 10,923,474 B2 | 2/2021 | Liaw | |
| 10,971,630 B2 | 4/2021 | Liaw | |
| 11,081,404 B2 | 8/2021 | Zhang | |
| 11,094,784 B2 | 8/2021 | Cheng | |
| 11,094,803 B1 | 8/2021 | Xie | |
| 11,923,432 B2* | 3/2024 | Liu | H01L 29/66553 |
| 2020/0035563 A1* | 1/2020 | Zhang | H01L 29/66439 |
| 2020/0343387 A1* | 10/2020 | Liaw | H01L 27/088 |
| 2021/0066506 A1* | 3/2021 | Liaw | H01L 29/66795 |
| 2021/0151561 A1* | 5/2021 | Li | H01L 29/42368 |
| 2021/0233909 A1* | 7/2021 | Bao | H01L 21/30604 |
| 2021/0305361 A1* | 9/2021 | Pranatharthi Haran | H01L 29/1037 |
| 2021/0384310 A1* | 12/2021 | Yuan | H01L 29/1079 |
| 2022/0130991 A1* | 4/2022 | Yu | H01L 29/0673 |
| 2022/0301936 A1* | 9/2022 | Merchant | H01L 29/66553 |
| 2022/0310786 A1* | 9/2022 | Merchant | H01L 29/7848 |
| 2022/0328500 A1* | 10/2022 | Cheng | H01L 29/40111 |
| 2022/0328655 A1* | 10/2022 | Li | H01L 29/2003 |
| 2022/0416035 A1* | 12/2022 | Chu | H01L 29/775 |
| 2023/0013047 A1* | 1/2023 | Chou | H01L 29/6684 |
| 2023/0121210 A1* | 4/2023 | Wang | H01L 21/0259 257/774 |

* cited by examiner

STACKED NANOSHEET GATE-ALL-AROUND DEVICE STRUCTURES

BACKGROUND

The present invention generally relates to nanosheet devices with gate-all-around structures, and more particularly to nanosheet devices with gate-all-around structures, and full channel and source/drain isolation.

A Field Effect Transistor (FET) typically includes a source, a channel, and a drain, where current flows from the source to the drain, and a gate controls the flow of current through the channel. FETs can be built in a variety of different configurations, including planar FET and FinFET configurations. In the case of a planar FET, the source, channel, and drain are formed in a substrate material, and the current flows horizontally along the channel (i.e., in the plane of the substrate). In the case of a FinFET, the channel extends outward from the substrate, where the current flows horizontally from a source to a drain. The channel for the FinFET can be an upright slab of thin rectangular silicon (Si), commonly referred to as the fin, with a gate on the fin, as compared to a metal-oxide-semiconductor field effect transistor (MOSFET) with a single gate parallel with the plane of the substrate.

N-type FETs or P-type FETs can be formed depending on the doping of the source and drain. Two FETs also can be coupled to form a complementary metal oxide semiconductor (CMOS) device, where a p-type MOSFET and n-type MOSFET are coupled together.

Nanosheet devices generally include stacks of layers, alternately including a nanosheet material, where the nanosheet material can be nanowire configured to conduct an electric current. Conventional techniques for patterning nanosheets produce nanosheets of the same size on the wafer, as the patterning is done using standard immersion lithography techniques that are limited in terms of critical dimensions (e.g., device width) that can be printed.

BRIEF SUMMARY

According to embodiments of the present invention, a semiconductor device includes a substrate; a continuous buried oxide layer on the substrate; and a plurality of nanosheet gate-all-round (GAA) device structures on the continuous buried oxide layer, wherein a first plurality of stacked gates of the nanosheet GAA device structures are disposed in a logic region of the substrate and have a first nanosheet width, wherein a second plurality of stacked gates of the nanosheet GAA device structures are disposed in a high density region of the substrate and have a second nanosheet width less than the first nanosheet width, wherein the nanosheet GAA device structures are disposed directly on the continuous buried oxide layer, and wherein a bottom layer of the nanosheet GAA device structures is a bottom gate disposed directly on the continuous buried oxide layer.

According to embodiments of the present invention, a structure includes: a substrate having a first region and a second region; a continuous buried oxide layer on the substrate; and a plurality of nanosheet stacks disposed directly on the continuous buried oxide layer, wherein each of the nanosheet stacks comprises: a silicon-germanium-on-insulator layer disposed directly on the continuous buried oxide layer; a first metal layer on the silicon-germanium-on-insulator layer; and a plurality of silicon-germanium layers disposed on the first metal layer and alternating with at least one additional metal layer, wherein the plurality of nanosheet stacks each comprise: a plurality of first nanosheet stacks having a first width in the first region; and a plurality of second nanosheet stacks having a second width in the second region, wherein the first width is different than the second width.

According to an embodiment of the present invention, a method for forming a semiconductor device includes providing a silicon-on-insulator (SOI) layer over a buried oxide layer and a substrate; depositing a blanket silicon germanium (SiGe) layer on the SOI layer; depositing an oxide layer on the silicon germanium; performing a thermal anneal to diffuse germanium of the silicon germanium into the SOI layer and form a SiGe-On-Insulator (SGOI) layer; removing the oxide layer; depositing a SiGe/Si super lattice on the SGOI layer; patterning a first portion of the SiGe/Si super lattice and the SGOI layer to form a first plurality of nanosheet stacks having a first width; and patterning a second portion of the SiGe/Si super lattice and the SGOI layer to form a second plurality of nanosheet stacks having a second width, wherein the second width is less than the first width.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:
  nanosheet based devices including variable width nanosheets formed on conventional silicon-on-insulator (SOI) substrates; and
  formation of nanosheet device structure fully isolated from the substrate by a dielectric buried oxide layer using a conventional SOI and including a bottom gate formed directly on a continuous dielectric isolation layer.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

The present invention generally relates to nanosheet devices with gate-all-around structures, and more particularly to nanosheet devices with gate-all-around structures and various nanosheet widths on a same wafer, and full channel and source/drain isolation.

Embodiments of the present invention include a structure and corresponding method to form stacked nanosheet (NS) devices with multiple nanosheet widths and fully isolated bottom gate and source/drain (S/D) structures. Embodiments of the present invention can enable 5 nm Complementary Metal-Oxide-Semiconductor (CMOS) features and below.

According to some embodiments of the present invention, a structure includes devices having a full bottom gate, a source and a drain isolated from a substrate, and a stacked nanosheet structure, where different devices on a same wafer have nanosheets with different widths. For example, logic devices and memory devices on the same wafer can have stacked nanosheet structures with different widths.

According to some embodiments of the present invention, a method includes forming a stacked nanosheet structure on silicon-on-insulator (SOI) using a germanium (Ge) enrichment method and optimized superlattice epitaxy (a method of growing or depositing monocrystalline films on a structure or surface), and forming multiple nanosheet widths on the same wafer with single exposure optical or Extreme Ultraviolet Lithography (EUV) for the direct patterning of wide nanosheets, whereas static random access memories (SRAMs) or dense logic devices (e.g., NAND gates, NOR gates, XOR gates, etc.) can be patterned with standard multiple optical patterning.

In conventional devices, it can be difficult to suppress a source-to-drain leakage with standard Punch-Through Stop (PTS) doping, since the dopants are typically lost during the thermal budget associated with the fabrication of stacked nanosheet devices. The source-to-drain leakage can result in a loss of gate control over a bottom parasitic channel on high performance wide-sheet devices. According to some embodiments of the present invention, dielectric isolation can be used to suppress a bottom parasitic channel. According to at least one embodiment of the present invention, the device structure includes multiple stacked NS structures with different widths on the same wafer, for example, in a logic region can have relatively wide nanosheet width and a memory region can have a relatively narrow nanosheet width with a relatively high pitch.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

According to embodiments of the present invention, a method 100 for forming a device (see FIG. 1) includes, at step 101, providing an SOI substrate over a buried oxide layer (BOX) and a silicon (Si) substrate; and at step 102, thinning the SOI substrate to a desired thickness. According to some embodiments, the thinning of the SOI substrate at step 102 can be performed by Si oxidation methods, including dry and/or wet oxidation techniques, cycles of thin oxidation/oxide etch methods. According to an example embodiment, step 102 includes depositing a first oxide layer, such as $SiO_2$. According to at least one embodiment, the SOI has a starting thickness of about 30 nanometers (nm) and a final thickness of a thinned SOI is between about 3 nm and 12 nm. According to some embodiments, at step 102, the first oxide layer, used to thin the SOI, is removed (e.g., etched) by, for example, Hydrofluoric (HF) acid, buffered HF, Chemical Oxide Removal (COR), SiCoNi®, etc.

Figure 1:
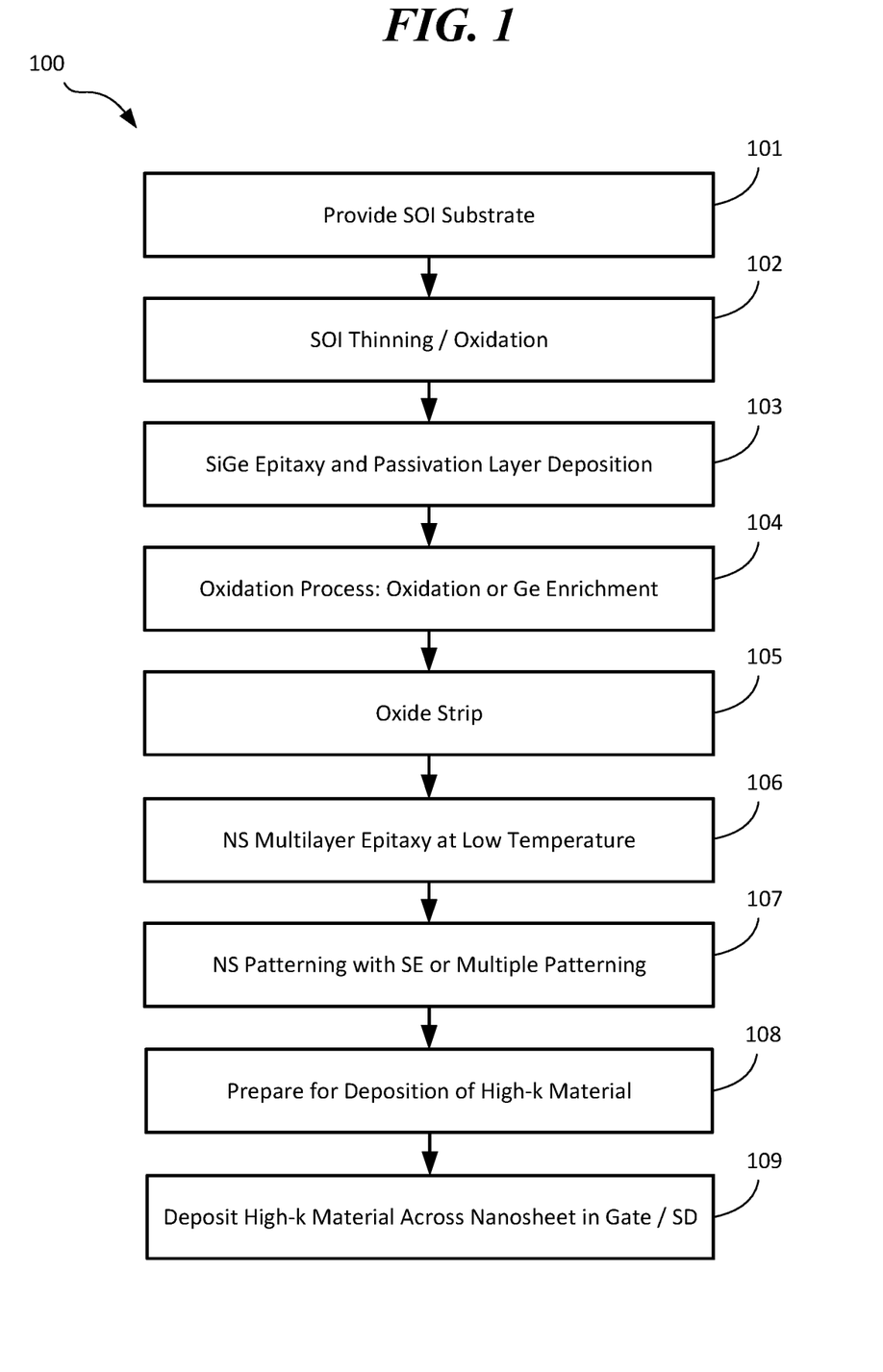
FIG. 1 is method of manufacturing a device according to one or more embodiments of the present invention.

According to some embodiments, the method further includes, at step 103, depositing a blanket silicon germanium (SiGe) layer on the thinned SOI, followed by depositing a second oxide layer. According to at least one embodiment, the deposition of the blanket SiGe layer at step 103 includes a SiGe epitaxy in the nanosheet regions (e.g., with a thickness between about 3 nm and 20 nm and with a germanium (Ge) content between about 10 and 60%). According to some embodiments, the second oxide layer is at least about 10 nm thick, which can stabilize the SiGe during a thermal anneal.

According to some embodiments, the method includes, at step 104, using a high temperature oxidation (e.g., temperature (T) greater than about 700 degrees Celsius (c)) to diffuse Ge into the thin SOI layer and form a SiGe-On-Insulator (SGOI). According to some embodiments, the high temperature oxidation at step 104 includes process cycles (repeated X-times) of a diffusion in a nitrogen (N2) ambient and an oxidation in an oxygen (O2) ambient. The process cycles can be performed isothermal or at different temperatures, which can control the Ge push down into the thin SOI. According to some embodiments, for an oxidation in the range 600-1100° C., (n-type Ge initial/n-type Ge final)= (thickness SiGe initial/thickness SiGe final), and the oxidation of Ge can be neglected since only Si atoms participate in the reaction. For example, starting with a thin SOI having a thickness of 8 nm and a SiGe layer (25% Ge) having a thickness of 8 nm, the resulting SGOI can have a thickness of 8 nm with 25% Ge.

According to some embodiments, the method includes an oxide removal at step 105, to remove the second oxide layer. The oxide removal can be, for example, HF-based or a reactive process (COR, SiCoNi . . . ).

According to some embodiments, the method further includes, at step 106, depositing a SiGe/Si super lattice at low temperature on the SGOI. According to one or more embodiments, the deposition of the Si/SiGe super lattice at step 106 includes a low temperature (e.g., less than about 700° C.) wafer loading and prebake, and a low temperature multilayer Si/SiGe epitaxy. According to one or more embodiments, the deposition of the Si/SiGe super lattice at step 106 begins with a Si nucleation, with n number of Si/SiGe stacks. According to an example embodiment, the SiGe has a Ge content between about 15 and 40%. According to some embodiment, these Si/SiGe stacks are nanosheet stacks.

According to some embodiments, the method includes, at step 107, patterning of the nanosheet stacks. According to some embodiments, for the patterning of the nanosheet stacks at step 107, in a logic region, a single exposure optical or EUV patterning can be used for the formation of a single wide nanosheet per active area, with the width of the nanosheet depending on a logic cell height. According to some embodiments, for the patterning of the nanosheet stacks at step 107 in a high density region, an aggressive pitch can be patterned using any of a variety of patterning techniques, such as Self-Aligned Double Patterning (SADP), Self-Aligned Quadruple Patterning (SAQP), litho-etch-litho-etch (LELE) processes, etc. to form the narrow stacked nanosheets. According to some embodiments, a critical dimension (e.g., a size of a feature of a device, such as an integrated circuit or transistor, that impacts the electrical properties of the device) of less than about 15 nm, and a pitch of less than about 40 nm can be achieved for the nanosheets in the high density region. According to at least one embodiment, each nanosheet stack in the logic region is disposed in a respective active area.

According to at least one embodiment, the gate stacks in the logic region and the high density region can be patterned at step 107 simultaneously, e.g., for dimensions greater than about 10 nm, for example, using single exposure optical or EUV patterning and the like. According to at least one embodiment, the gate stacks in the logic region and the high density region have different widths.

According to some embodiments, in a case where the width the nanosheets in the second region is less than about 10 nm, different patterning processes/techniques can be used in the first region and the second region. For example, SADP, SAQP, or other patterning techniques, may be used in the second region to achieve dimensions less than about 10 nm (e.g., nanosheet width) to form the narrow stacked nanosheets, and a single exposure EUV patterning may be used in the first region to form the wide stacked nanosheets. According to some embodiment, different patterning processes can be performed independently in the first region and the second region by performing/iterating step 107 of FIG. 1 for each region.

According to some embodiments, at step 108, the device is prepared for a deposition of a high-K (HK) dielectric material. According to some embodiments, preparing the device for deposition of the high-K dielectric material includes supporting end portions of the Si layers in the Si/SiGe stacks and removing the SGOI layer and the SiGe layers, such that the high-K (HK) dielectric material can be deposited around the Si layers. It should be understood that various methods can be used to prepare the device.

According to some embodiments, the method includes, at step 109, depositing a high-K dielectric material across the nanosheet gate. Examples of high-K dielectrics include, but are not necessarily limited to, HfO2 (hafnium oxide), ZrO2 (zirconium dioxide), hafnium zirconium oxide (HfZrO), Al2O3 (aluminum oxide), and Ta2O5 (tantalum oxide). Other examples of high-K dielectrics include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to some embodiments, the deposition of the high-K dielectric material across the nanosheet gate at step 109 forms a gate-all-around structures (i.e., gate stacks) including alternating layers of the high-K dielectric material and work function metal (WFM) (i.e., the Si layers 802 extending between S/D structures—see FIG. 11). Examples of the work function metal include, but are not necessarily limited to, for a pFET device, titanium nitride (TiN), tantalum nitride (TaN) or ruthenium (Ru), and for an nFET device, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, which can be deposited on a gate dielectric layer. Further, the deposition of the high-K dielectric material across the nanosheet gate at step 109 forms a portion of the full bottom gate, below the gate stacks and the source/drain regions.

Figure 2:
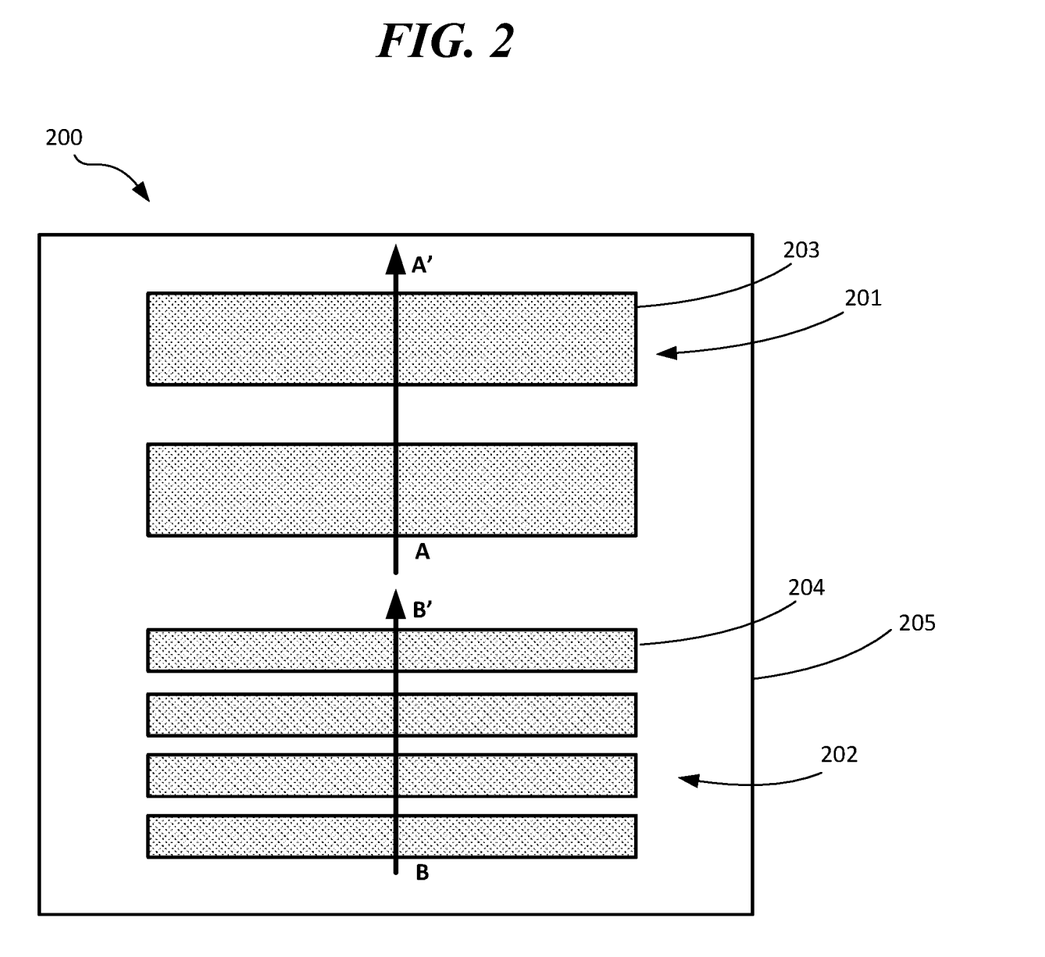
FIG. 2 is a planar view of a device having stacked nanosheet device regions according to some embodiments of the present invention.

According to one or more embodiments and referring to FIG. 2, in a planar view of a device 200 having stacked nanosheet device regions, a logic region 201 has wide stacked nanosheets 203 and a high density region 202 (such as SRAM region) has narrow stacked nanosheets 204, the stacked nanosheets of the logic region 201 and the high density region 202 is surrounded by an isolation region 205.

FIG. 2 further includes cross-sections A-A' and B-B', which are depicted in FIGS. 3-11. That is, FIGS. 3-11 are cross-section views of the device 200 of FIG. 2 at different steps in a manufacturing process of FIG.1 according to one or more embodiments of the present invention.

Figure 3:
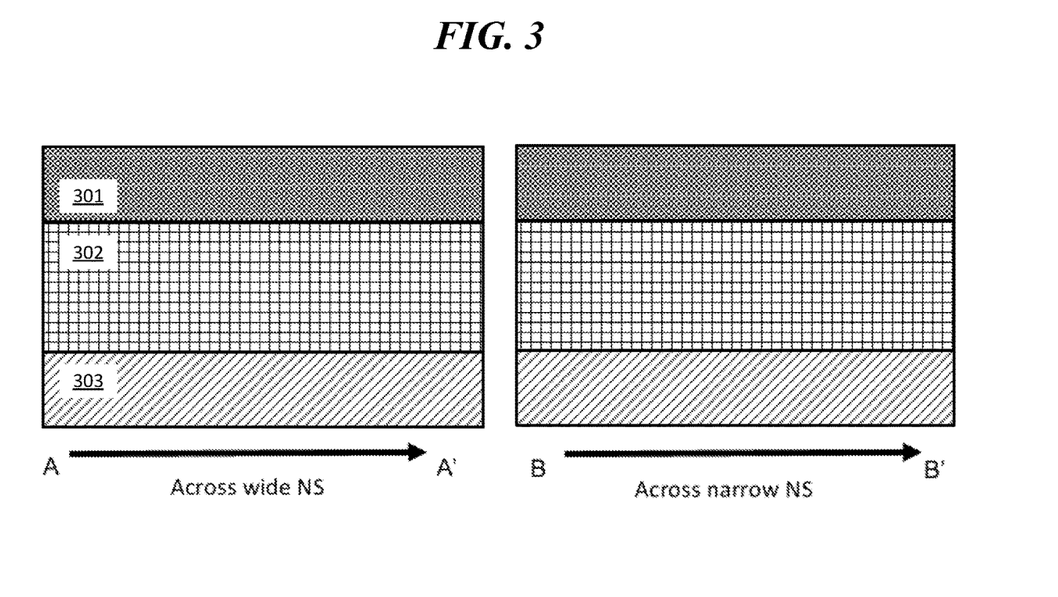
FIGS. 3-10 are cross-section views of the device of FIG. 2 at different steps in a manufacturing process according to one or more embodiments of the present invention.
Figure 4:
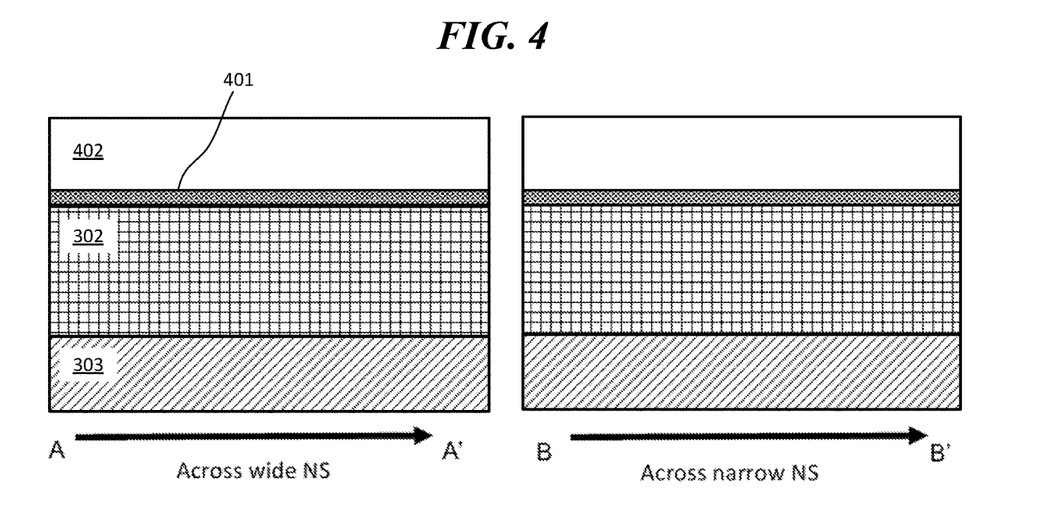
Figure 5:
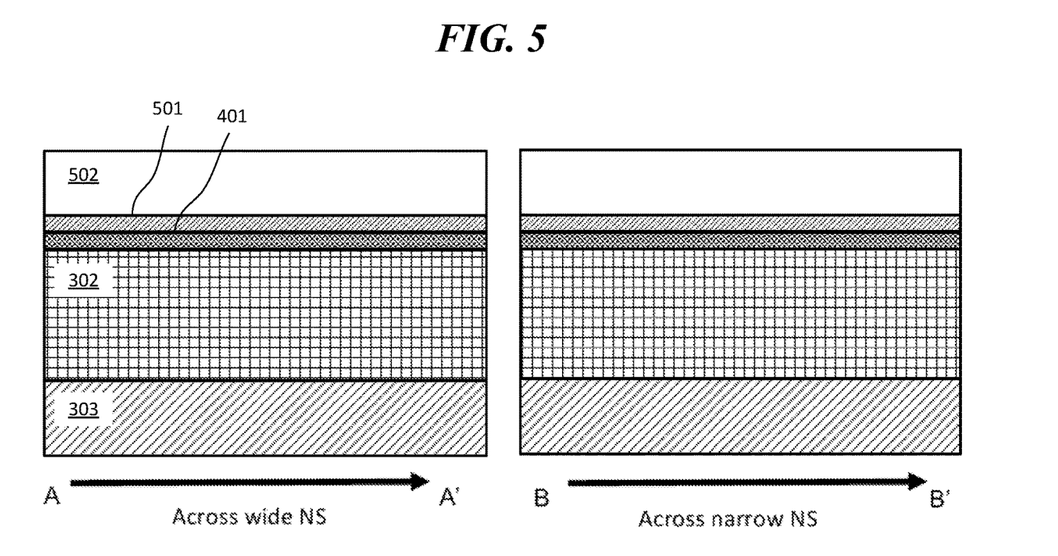

According to embodiments of the present invention, a method for forming a semiconductor device includes providing a SOI material 301 over a buried oxide layer (BOX) 302 and a Si substrate 303 as shown in FIG. 3; and forming a thin SOI layer 401 having a desired thickness (e.g., between about 3 nm and 12 nm) as shown in FIG. 4. According to an example embodiments, the buried oxide layer 302 is a continuous dielectric film disposed on the substrate 303. According to some embodiments, the thinning of the SOI substrate can be performed by Si oxidation methods, using a layer of silicon dioxide ($SiO_2$) 402. According to some embodiments and referring to FIG. 5, a blanket SiGe layer 501 is formed on the Si substrate 303 covered by an oxide passivation layer, i.e., the buried oxide layer 302 and the thin SOI layer 401.

Figure 6:
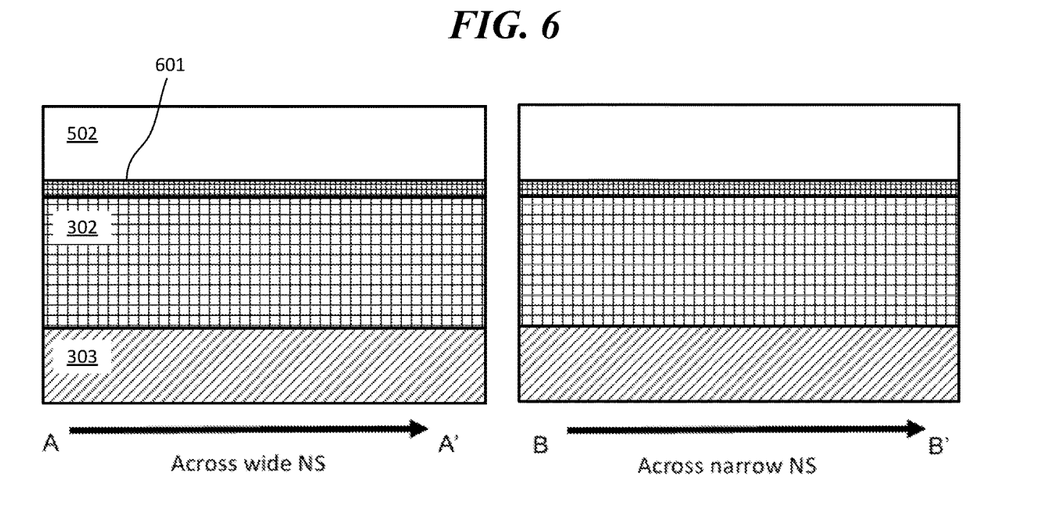
Figure 7:
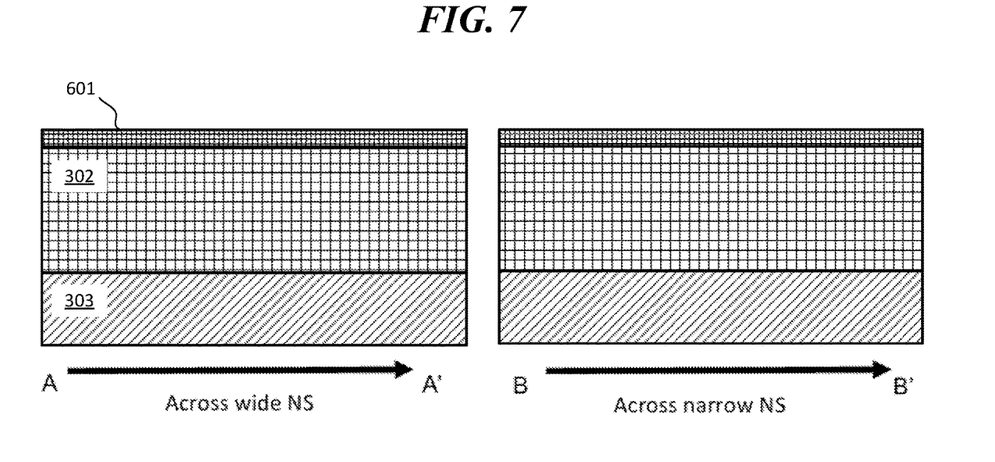

According to at least one embodiment, an oxide layer 502 can be deposited, which can stabilize the SiGe 501 during a thermal anneal. According to some embodiments, a high temperature oxidation (e.g., temperature (T) greater than about 700 degrees Celsius (c)) can be used to diffuse Ge into the thin SOI layer 401 and form the SGOI 601 as shown in FIG. 6. According to example embodiments, the SGOI 601 has a thickness of about 8 nm. According to some embodiments, the method includes an oxide removal exposing the SGOI 601 as illustrated by FIG. 7.

Figure 8:
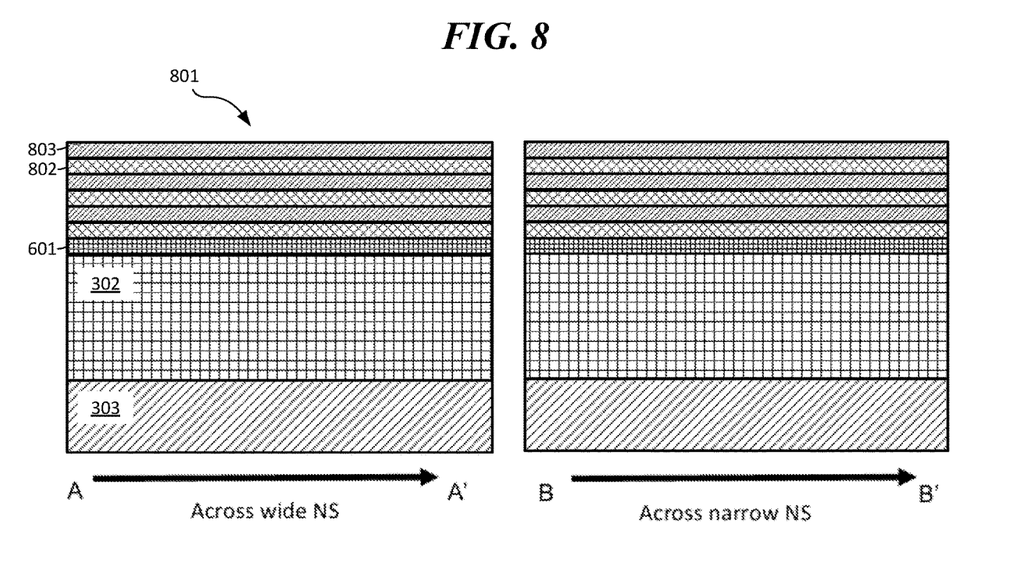

According to some embodiments, a SiGe/Si super lattice 801 is formed on the formed SGOI 601 as shown in FIG. 8. According to example embodiments, the SiGe/Si super lattice 801 includes alternating layers of Si 802 and SiGe 803. According to example embodiments, the SiGe/Si super lattice 801 has a same number of layers in the logic region and the high density region.

Figure 9:
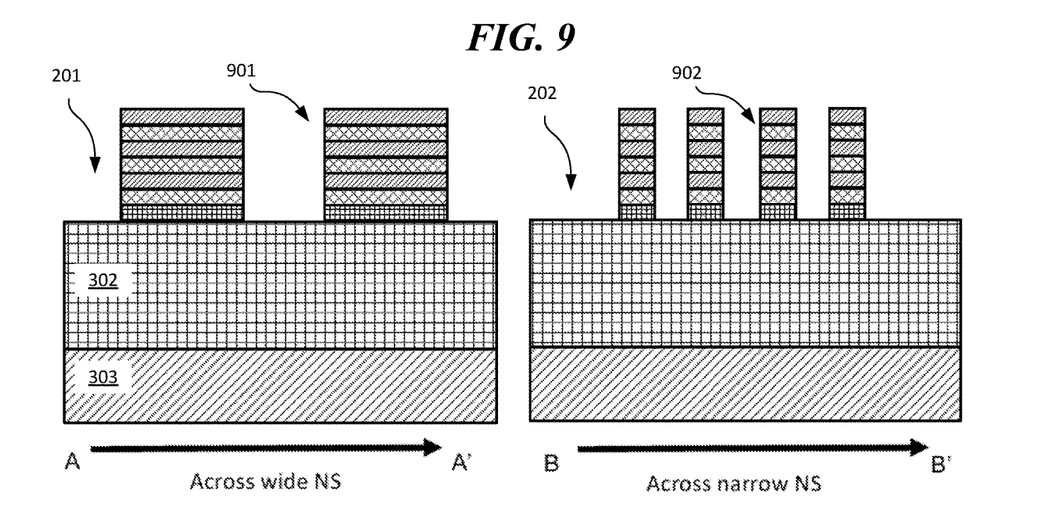

According to one or more embodiments and referring to FIG. 9, first nanosheet stacks 901 are formed in the logic region 201 and second nanosheet stacks 902 are formed in the high density region 202.

According to some embodiments, the SiGe and SGOI materials are removed selectively, leaving in place materials including the Si layers 802 and any dielectrics. The selective removal can be performed using, for example, a dry hydrochloric acid (HCL) etch or a remote plasma clean (RPC) process. According to at least one embodiment, the selective removal of the SiGe and SGOI materials is a lateral etch removing end portions of the SiGe and SGOI materials. According to some embodiments, following the removing of the end portions of the SiGe and SGOI materials, spacers 1103 (see FIG. 11) are formed. According to at least one embodiment, the remaining SiGe and SGOI materials are removed. S/D structures (see 1101, FIG. 11) can be formed before or after the removal of the remaining SiGe and SGOI materials.

Figure 10:
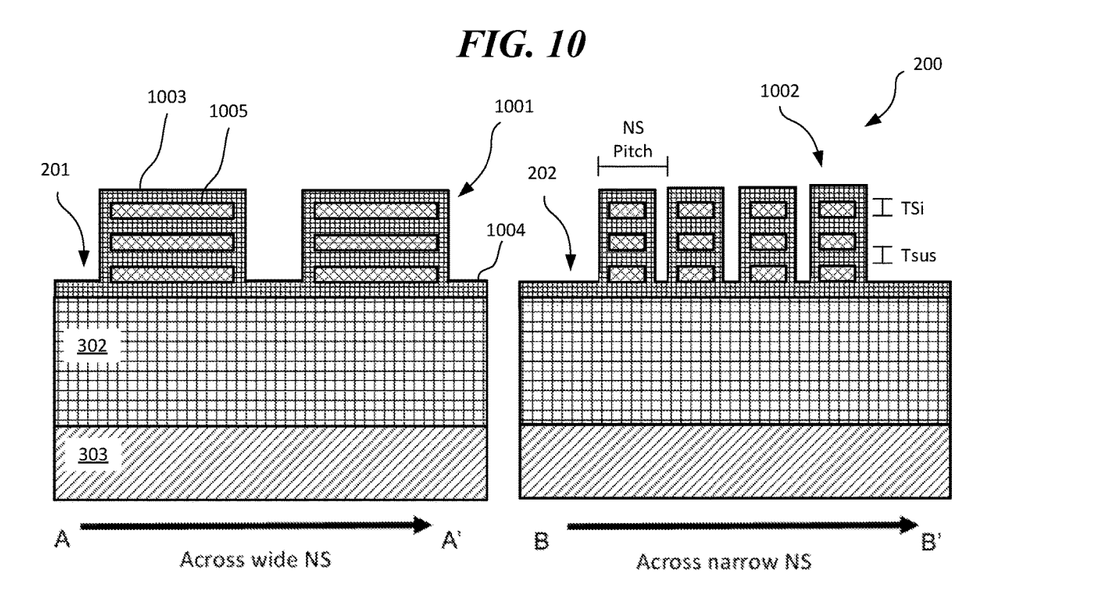
Figure 11:
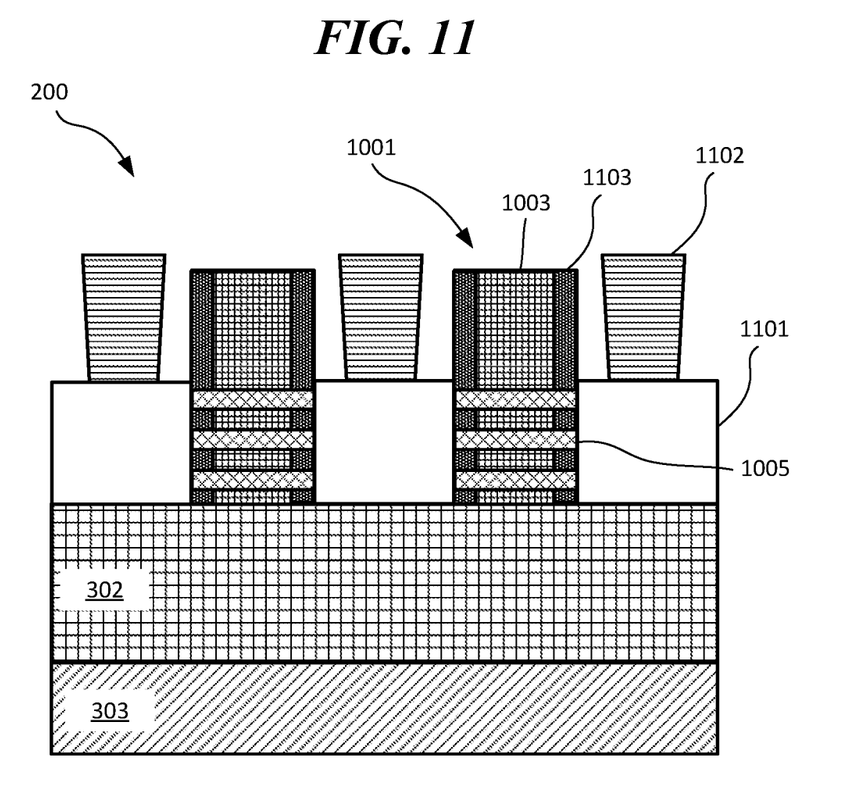
FIG. 11 is a cross-section via of the device of FIG. 2 and perpendicular to the view of FIGS. 3-10.

According to some embodiments and referring to FIG. 10 and FIG. 11, a high-K (HK) dielectric material 1003 is deposited across the device 200 (see FIG. 2). According to some embodiments, the deposition of the high-K dielectric material 1003 across on the first and second nanosheet stacks 901 and 902 forms gate-all-around structures (i.e., the gate stacks) 1001 and 1002, which includes alternating layers of the high-K dielectric material 1003 and work function metal 1005. Further, the deposition of the high-K dielectric material across the nanosheet gate forms a full bottom gate 1004, below the first and second nanosheet stacks 901 and 902.

According to embodiments of the present invention and referring to FIG. 10, a semiconductor device 200 includes a substrate 303 with a continuous buried oxide layer 302; nanosheet gate-all-round (GAA) device structures formed on the continuous buried oxide layer 302, where a first plurality of stacked gates 1001 of the nanosheet GAA device structures are formed in a logic region 201 of the substrate and have a relatively wide nanosheet width, and wherein a second plurality of stacked gates 1002 of the nanosheet GAA device structures are formed in a high density region 202 of the substrate and have a relatively narrow nanosheet width, wherein the nanosheet GAA device structures have layers of the high-K dielectric material 1003 (Si) and work function metal 1005 (e.g., Si) laying directly on top of the continuous buried oxide layer 302, wherein a bottom layer of the nanosheet GAA device structures is a bottom gate 1004 formed directly on the continuous buried oxide layer 302, and wherein the nanosheet gate-all-round (GAA) device structures have a plurality source-drain regions (see FIG. 11).

According to embodiments of the present invention, the Silicon channel (TSi) in the first region can have a different thickness than the TSi in the second region. According to embodiments of the present invention, the space between the nanosheets (Tsus) in the first region can have a different thickness than the Tsus in the second region. For example, different SiGe/Si superlattice stacks can be built/grown independently in the first region and the second region by performing/iterating step 106 of FIG. 1 for each region.

According to some embodiments and referring to FIG. 11, a cross section of the device 200 perpendicular to the A-A', B-B' direction is shown across a gate 1001. According to example embodiments, the gate 1001 includes the high-K dielectric material 1003 configured as a gate electrode, the work function metal 1005 configured as channels between the S/D structures 1101, and spacers 1103. According to at least one embodiment, S/D structures 1101 are connected to both sides of the work function metal 1005. According to example embodiments, a contact 1102 is formed on each S/D structure. According to some embodiments, the spacers 1103 isolate the high-K dielectric material 1003 from the S/D structures 1101.

Recapitulation:

According to embodiments of the present invention, a device 200 includes a substrate 303; a continuous buried oxide layer 302 formed on the substrate; and a plurality of nanosheet gate-all-round (GAA) device structures 1001, 1002 formed on the continuous buried oxide layer, wherein a first plurality of stacked gates 1001 of the nanosheet GAA device structures are disposed in a logic region of the substrate and have a first nanosheet width, wherein a second plurality of stacked gates 1002 of the nanosheet GAA device structures are disposed in a high density region of the substrate and have a second nanosheet width less than the first nanosheet width, wherein the nanosheet GAA device structures are disposed directly on the continuous buried oxide layer, and wherein a bottom layer of the nanosheet GAA device structures is a bottom gate 1004 disposed directly on the continuous buried oxide layer.

According to embodiments of the present invention, a structure includes: a substrate 303 having a first region 201 and a second region 202; a continuous buried oxide layer 302 on the substrate; and a plurality of nanosheet stacks 901, 902 disposed directly on the continuous buried oxide layer, wherein each of the nanosheet stacks comprises: a silicon-germanium-on-insulator layer 601 disposed directly on the continuous buried oxide layer; a first metal layer on the silicon-germanium-on-insulator layer; and a plurality of silicon-germanium layers 803 disposed on the first metal layer and alternating with at least one additional metal layer 802, wherein the plurality of nanosheet stacks each comprise: a plurality of first nanosheet stacks 901 having a first width in the first region; and a plurality of second nanosheet stacks 902 having a second width in the second region, wherein the first width is different than the second width.

According to an embodiment of the present invention, a method 100 for forming a semiconductor device includes providing a silicon-on-insulator (SOI) layer over a buried oxide layer and a substrate at step 101; depositing a blanket silicon germanium (SiGe) layer on the SOI layer at step 103; depositing an oxide layer on the silicon germanium at step 104; performing a thermal anneal to diffuse germanium of the silicon germanium into the SOI layer and form a SiGe-On-Insulator (SGOI) layer at step 104; removing the oxide layer at step 105; depositing a SiGe/Si super lattice on the SGOI layer at step 106; patterning a first portion of the SiGe/Si super lattice and the SGOI layer to form a first plurality of nanosheet stacks at step 107 having a first width; and patterning a second portion of the SiGe/Si super lattice and the SGOI layer to form a second plurality of nanosheet stacks at step 107 having a second width, wherein the second width is less than the first width.)

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a substrate;
   a continuous buried oxide layer on the substrate; and
   a plurality of nanosheet gate-all-round (GAA) device structures on the continuous buried oxide layer,
   wherein a first plurality of stacked gates of the nanosheet GAA device structures are disposed in a logic region of the substrate and have a first nanosheet width,
   wherein a second plurality of stacked gates of the nanosheet GAA device structures are disposed in a high density region of the substrate and have a second nanosheet width less than the first nanosheet width,
   wherein the nanosheet GAA device structures are disposed directly on the continuous buried oxide layer, and
   wherein a bottom layer of the nanosheet GAA device structures is a bottom gate disposed directly on the continuous buried oxide layer.

2. The device of claim 1, wherein the nanosheet GAA device structures comprise a plurality of alternating layers of a high-K gate material and a metal material.

3. The device of claim 2, wherein the layers of the high-K gate material and the metal material have different thicknesses.

4. The device of claim 2, wherein the layers of the high-K gate material and the metal material have a same thickness.

5. The device of claim 2, wherein the layers of the first plurality of stacked gates and the layers of the second plurality of stacked gates have different thicknesses.

6. The device of claim 2, wherein the layers of the first plurality of stacked gates and the layers of the second plurality of stacked gates have a same thickness.

7. The device of claim 1, further comprising a plurality source-drain regions fully isolated from the substrate by the continuous buried oxide layer.

8. The device of claim 1, wherein the first plurality of stacked gates and the second plurality of stacked gates have a same number of layers.

9. The device of claim 1, wherein each stacked gate of the first plurality of stacked gates is disposed in a respective active area of a first region of the substrate.

10. The device of claim 1, wherein each of the second plurality of stacked gates has a critical dimension less than about 15 nanometers.

11. The device of claim 1, wherein the second plurality of stacked gates have a pitch of less than about 40 nanometers.

12. The device of claim 1, wherein each of the first plurality of stacked gates has a critical dimension of at least 10 nanometers and each of the second plurality of stacked gates has a critical dimension less than about 10 nanometers.

13. A structure comprising:
    a substrate having a first region and a second region;
    a continuous buried oxide layer on the substrate; and
    a plurality of nanosheet stacks disposed directly on the continuous buried oxide layer, wherein each of the nanosheet stacks comprises:
    a silicon-germanium-on-insulator layer disposed directly on the continuous buried oxide layer;

a first metal layer on the silicon-germanium-on-insulator layer; and a plurality of silicon-germanium layers disposed on the first metal layer and alternating with at least one additional metal layer, wherein the plurality of nanosheet stacks each comprise:

a plurality of first nanosheet stacks having a first width in the first region; and a plurality of second nanosheet stacks having a second width in the second region, wherein the first width is different than the second width.

14. The structure of claim 13, wherein each of the first nanosheets are disposed in a respective active area of the first region.

15. The structure of claim 13, wherein each of the second nanosheets has a critical dimension less than about 15 nanometers.

16. The structure of claim 15, wherein the plurality of second nanosheets have a pitch of less than about 40 nanometers.

17. A method for forming a semiconductor device comprising:

providing a silicon-on-insulator (SOI) layer over a buried oxide layer and a substrate;

depositing a blanket silicon germanium (SiGe) layer on the SOI layer;

depositing an oxide layer on the silicon germanium;

performing a thermal anneal to diffuse germanium of the silicon germanium into the SOI layer and form a SiGe-On-Insulator (SGOI) layer;

removing the oxide layer;

depositing a SiGe/Si super lattice on the SGOI layer;

patterning a first portion of the SiGe/Si super lattice and the SGOI layer to form a first plurality of nanosheet stacks having a first width; and patterning a second portion of the SiGe/Si super lattice and the SGOI layer to form a second plurality of nanosheet stacks having a second width, wherein the second width is less than the first width.

18. The method of claim 17, further comprising:

forming a plurality of spacers supporting ends of a plurality of Si layers of the SiGe/Si super lattice;

removing a plurality of SiGe layers of the SiGe/Si super lattice; and depositing a high-K gate material to form a plurality of gate-all-around structures including alternating layers of the high-K gate material and the plurality of Si layers, wherein the high-K gate material forms a full bottom gate on a bottom of the plurality of gate-all-around structures.

19. The method of claim 17, further comprising thinning the SOI layer.

20. The method of claim 17, wherein the deposition of the SiGe/Si super lattice is performed at a temperature of less than about 700 degrees Celsius.

* * * * *